United States Patent
Kim et al.

(10) Patent No.: US 10,820,424 B2
(45) Date of Patent: Oct. 27, 2020

(54) SLOT DIE WITH VARIABLE NOZZLES

(71) Applicant: SUNG AN MACHINERY CO., LTD., Hwaseong-si, Gyeonggi-do (KR)

(72) Inventors: Yong Sung Kim, Anseong-si (KR); Ok Jin Kim, Hwaseong-si (KR); Jin Woo Seong, Ansan-si (KR); Young Jin Kim, Suwon-si (KR)

(73) Assignee: SUNG AN MACHINERY CO., LTD., Hwaseong-si (KR)

( * ) Notice: Subject to any disclaimer, the term of this patent is extended or adjusted under 35 U.S.C. 154(b) by 34 days.

(21) Appl. No.: 16/095,163

(22) PCT Filed: Oct. 25, 2017

(86) PCT No.: PCT/KR2017/011826
§ 371 (c)(1),
(2) Date: Oct. 19, 2018

(87) PCT Pub. No.: WO2018/080160
PCT Pub. Date: May 3, 2018

(65) Prior Publication Data
US 2019/0141838 A1    May 9, 2019

(30) Foreign Application Priority Data
Oct. 27, 2016   (KR) ........................ 10-2016-0140738

(51) Int. Cl.
*H05K 3/12*        (2006.01)
*B41J 2/14*        (2006.01)
(Continued)

(52) U.S. Cl.
CPC ......... *H05K 3/1241* (2013.01); *B05C 5/0254* (2013.01); *B05C 11/048* (2013.01);
(Continued)

(58) Field of Classification Search
USPC ................. 118/410–413; 239/451, 597, 598
See application file for complete search history.

(56) References Cited

U.S. PATENT DOCUMENTS

| | | | |
|---|---|---|---|
| 6,344,088 B1 * | 2/2002 | Kamikihara | B05C 5/0254 118/712 |
| 9,067,229 B2 * | 6/2015 | Seo | B05C 5/0262 |

FOREIGN PATENT DOCUMENTS

| | | |
|---|---|---|
| JP | 3453335 B2 | 10/2003 |
| JP | 2006-167532 A | 6/2006 |

(Continued)

*Primary Examiner* — Yewebdar T Tadesse
(74) *Attorney, Agent, or Firm* — Novick, Kim & Lee, PLLC; Sang Ho Lee

(57) ABSTRACT

Provided is a slot die with variable nozzles. The slot die with variable nozzles, which applies ink on a substrate to perform a coating process, includes: a first body having a cavity configured to accommodate ink supplied from the outside; a second body spaced apart from the first body in a transfer direction of a substrate or a direction opposite to the transfer direction; a shim plate coupled between the first body and the second body and having an discharge port configured to communicate with the cavity and discharge ink accommodated in the cavity toward the substrate; and a plurality of variable nozzles disposed at a lower end of the first body or the second body in a width direction of the substrate so as to be adjacent to the discharge port, wherein each of the plurality of variable nozzles is independently driven according to a state of the ink coated on the substrate and adjusts a partial discharge amount of the ink discharged from the discharge port by changing a partial area of the discharge port at an arrangement position thereof.

3 Claims, 14 Drawing Sheets

(51) Int. Cl.
  *B41J 2/155*   (2006.01)
  *B05C 5/02*   (2006.01)
  *B05C 11/04*   (2006.01)
  *H01L 21/48*   (2006.01)
  *H01L 21/67*   (2006.01)

(52) U.S. Cl.
  CPC ............ *B41J 2/14* (2013.01); *B41J 2/155* (2013.01); *H01L 21/48* (2013.01); *H01L 21/6715* (2013.01); *B41J 2002/14362* (2013.01); *B41J 2202/19* (2013.01); *H05K 2203/013* (2013.01); *H05K 2203/0776* (2013.01)

(56) References Cited

FOREIGN PATENT DOCUMENTS

| JP | 2010-527819 A | 8/2010 |
| KR | 10-0775226 B1 | 11/2007 |
| KR | 10-2010-0023580 A | 3/2010 |
| KR | 10-1360220 B1 | 2/2014 |

* cited by examiner

SLOT DIE WITH VARIABLE NOZZLES

TECHNICAL FIELD

The present invention relates to a slot die with variable nozzles, and more particularly, to a slot die with variable nozzles, capable of improving coating uniformity of ink in a width direction of a substrate and improving convenience of maintenance.

BACKGROUND ART

Recently, printed electronics technology that manufactures electronic devices by forming various patterns by printing functional ink (hereinafter, collectively referred to as ink) on various types of substrates has attracted attention.

Such printed electronics technology has an advantage that the manufacturing process is not complicated, as compared with photolithography technology that has been used for forming patterns on a substrate in the past. Furthermore, a roll-to-roll printing apparatus, which prints ink on a roll-shaped film or web (hereinafter, collectively referred to as a film) continuously supplied, further increases production efficiency of electronic devices by rapid production speed due to a continuous process.

In general, the roll-to-roll printing apparatus performs a coating process of applying ink on a film so as to perform a printing process on the film. Such a coating process may be performed by a gravure method, a rotary screen method, a slot die method, or the like. Among them, the coating method using a slot die has advantages in that coating can be performed on a wide width of a substrate all at once, there is no change in ink viscosity, a foreign material is not introduced, and the reproducibility of ink coating is excellent.

Meanwhile, printing accuracy is very important so as to manufacture an electronic device by using printed electronics technology for printing ink on a substrate. In general, an electronic device requires a printing accuracy of several to several tens of microns (μm) according to an object to which the electronic device is applied.

In general, a slot die, which performs a slot die coating process, requires ink to be thinly and uniformly applied on a substrate so as to improve the printing accuracy of an electronic device. To this end, it is important to quantitatively adjust ink supplied to the slot die and to coat a thin ink film to a desired thickness by adjusting a gap between the slot die and the substrate according to a coating process condition such as a type, transfer speed, or the like of the substrate.

However, in the conventional slot die, when a gap between the slot die and substrate is adjusted and a supply amount or an discharge amount of ink is adjusted, the ink coated on the substrate is not uniform in a width direction of the substrate (lengthwise direction of the slot die as a whole.

In addition, in the conventional slot die, when a foreign material is introduced into an discharge port, after the whole of the slot die is disassembled and the foreign is removed, the slot die should be assembled and set again, resulting in difficulty in maintenance.

Therefore, there is a need for slot die capable of improving coating uniformity of ink in a width direction of a substrate and improving convenience of maintenance.

SUMMARY OF INVENTION

Technical Problem

The present invention has been made in an effort to solve the above problems, and an object of the present invention is to provide a slot die with variable nozzles, capable of improving coating uniformity of ink in a width direction of a substrate by independently driving each of a plurality of variable nozzles according to a state of ink coated on a substrate during a substrate coating process, and thus, controlling a partial discharge amount of the ink.

In addition, an object of the present invention is to provide a slot die with variable nozzles, capable of improving convenience of maintenance by detachably coupling a plurality of variable nozzles to a lower end of a first body or a second body.

The technical objects of the present invention are not limited to the above-mentioned object, and other technical objects will be clearly understood from the following description by those skilled in the art.

Solution to Problem

In order to achieve the above objects, a slot die with variable nozzles, which applies ink on a substrate to perform a coating process, includes: a first body having a cavity configured to accommodate ink supplied from the outside; a second body spaced apart from the first body in a transfer direction of a substrate or a direction opposite to the transfer direction; a shim plate coupled between the first body and the second body and having an discharge port configured to communicate with the cavity and discharge ink accommodated in the cavity toward the substrate; and a plurality of variable nozzles disposed at a lower end of the first body or the second body in a width direction of the substrate so as to be adjacent to the discharge port, wherein each of the plurality of variable nozzles is independently driven according to a state of the ink coated on the substrate and adjusts a partial discharge amount of the ink discharged from the discharge port by changing a partial area of the discharge port at an arrangement position thereof.

According to a first embodiment of the present invention, each of the plurality of variable nozzles includes a rotation block rotatably connected to the lower end of the first body or the second body; and an angle adjustment portion connected to the rotation block and configured to adjust an angle of the rotation block with respect to the lower end of the first body or the second body, wherein, when the angle with respect to the lower end of the first body or the second body is changed by the angle adjustment portion, the rotation block changes the partial area of the discharge port at an arrangement position thereof.

The rotation block is hinge-coupled to a second hinge hole formed in a hinge arm protruding from the lower end of the first body or the second body through a pin inserted into a first hinge hole formed at a central portion thereof.

The angle adjustment portion is screw-coupled to a through-hole having a female screw formed at a position adjacent to the first hinge hole and includes a screw member connected to the lower end of the first body or the second body.

Each of the plurality of variable nozzles further includes an angle adjustment driver connected to at least one of the rotation block and the angle adjustment portion and configured to drive at least one of the rotation block and the angle adjustment portion according to the state of the ink coated on the substrate.

According to a second embodiment of the present invention, each of the plurality of variable nozzles includes a movement block movably coupled to the lower end of the first body or the second body; and a position adjustment portion connected to the movement block and configured to adjust a position of the movement block with respect to the lower end of the first body or the second body, wherein, when the position with respect to the lower end of the first body or the second body is changed by the position adjustment portion, the moment block changes the partial area of the discharge port at an arrangement position.

The movement block is coupled to the lower end of the first body or the second body so as to reciprocate in a direction toward the discharge port.

The position adjustment portion is screw-coupled to a coupling hole of a fixing end elongated in the width direction of the substrate at the lower end of the first body or the second body so as to be adjacent to the other end of the movement block and includes a screw member connected to the other end of the movement block.

Each of the plurality of variable nozzles further includes a position adjustment driver connected to at least one of the movement block and the position adjustment portion and configured to drive at least one of the movement block and the position adjustment portion according to the state of the ink coated on the substrate.

Specific matters of the embodiments are included in the detailed description and the drawings.

Advantageous Effects of Invention

According to a slot die with variable nozzles according to an embodiment of the present invention, each of a plurality of variable nozzles may be independently driven according to a state of ink coated on a substrate during a substrate coating process to control a partial discharge amount of the ink, thereby improving coating uniformity of ink in a width direction of a substrate.

In addition, according to a slot die with variable nozzles according to an embodiment of the present invention, since a plurality of variable nozzles are detachably coupled to a lower end of a first body or a second body, even when a foreign material is introduced into an discharge port during a substrate coating process, only a specific variable nozzle may be disassembled and assembled without entirely disassembling the slot die, thereby improving convenience of maintenance.

The effects of the present invention are not limited to the effects mentioned above, and other effects can be clearly understood from the description of the claims by those skilled in the art.

DESCRIPTION OF EMBODIMENTS

Figure 1:
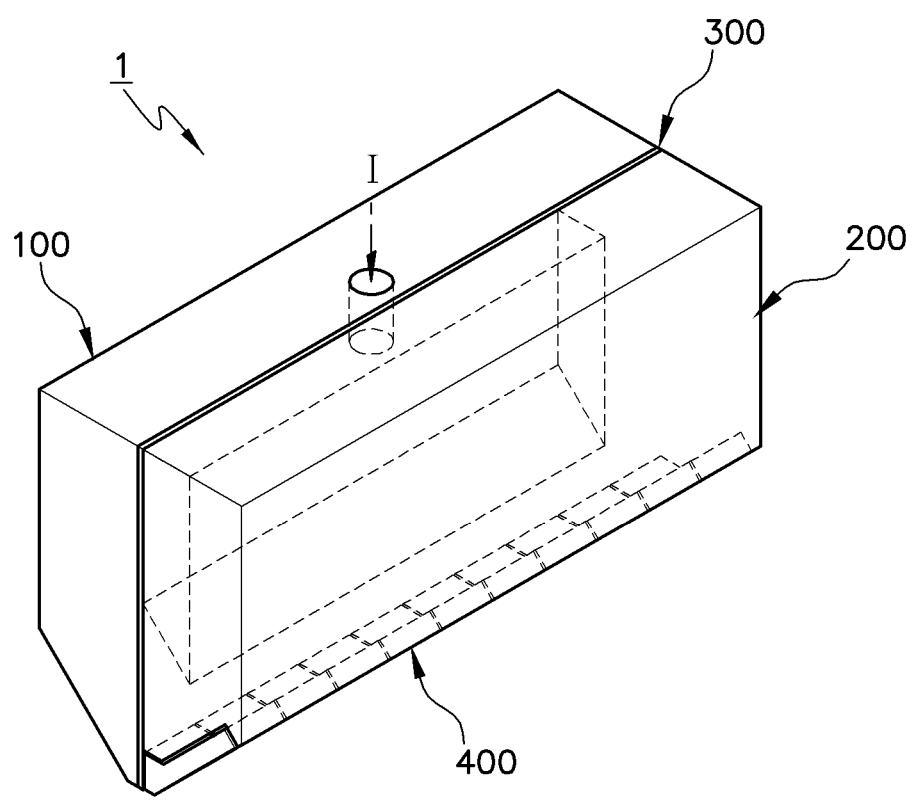
FIG. 1 is a perspective view illustrating structure of a slot die with variable nozzles according to embodiments of the present invention.

Hereinafter, preferred embodiments of the present invention will be described in detail with reference to the accompanying drawings so that they can be readily implemented by those skilled in the art.

A description of technical content that is well known to those skilled in the art and is not directly related to the present invention is omitted when embodiments of the present invention are described. The reason for this is to omit unnecessary description, and to more definitely transmit the gist of the present invention rather than making the gist of the present invention unclear.

For the same reason, some components in the drawings are exaggeratedly shown, omitted, or schematically shown. The sizes of respective components in the drawings do not reflect actual sizes. The same or similar reference symbols are used throughout the drawings to refer to the same or like parts.

Hereinafter, the present invention will be described with reference to the drawings illustrating a slot die 1 with variable nozzles through embodiments of the present invention.

Figure 2:
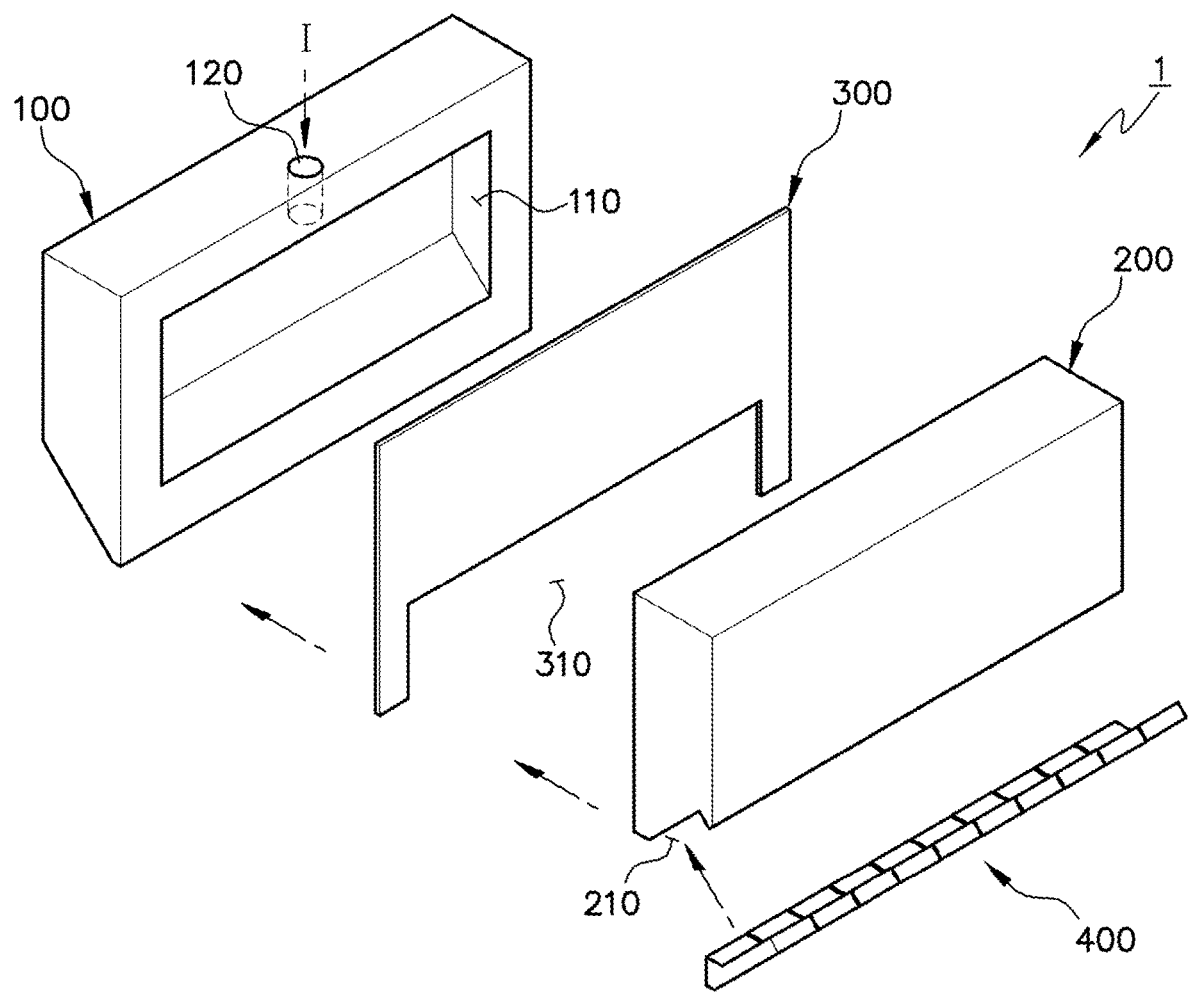
FIG. 2 is an exploded perspective view illustrating the structure of the slot die with the variable nozzles according to embodiments of the present invention.
Figure 3:
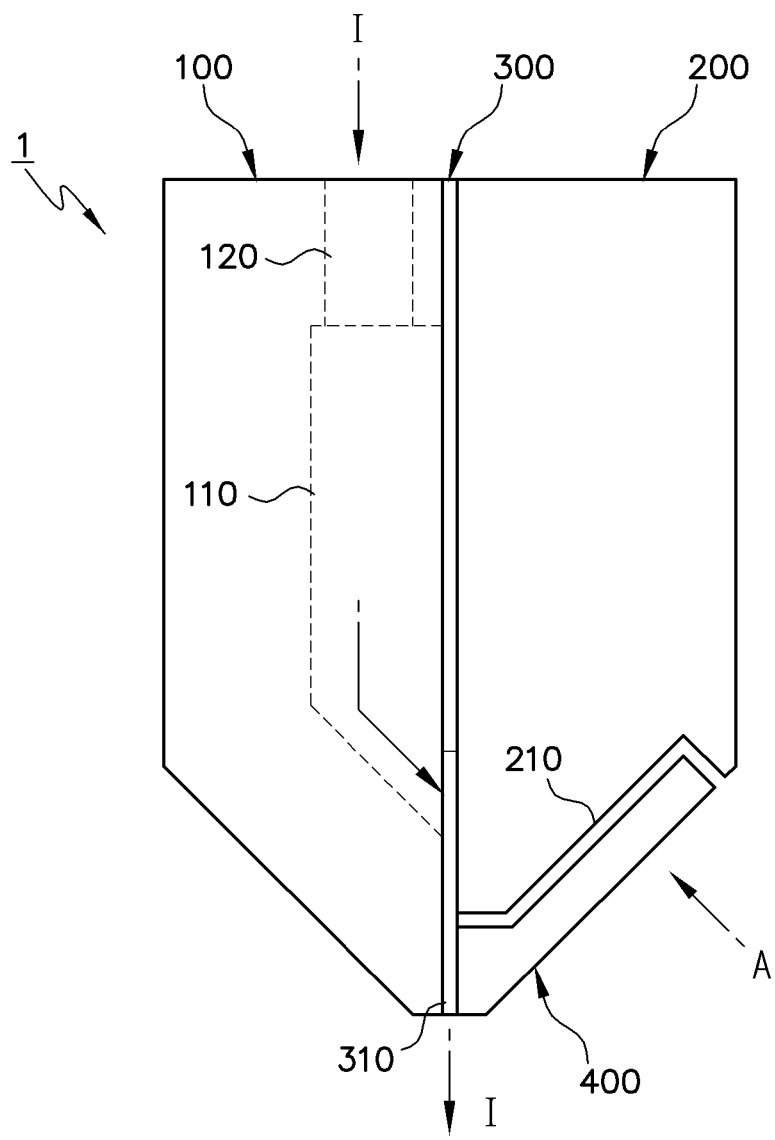
FIG. 3 is a front view illustrating the structure of the slot die with the variable nozzles according toe embodiments of the present invention.
Figure 4:
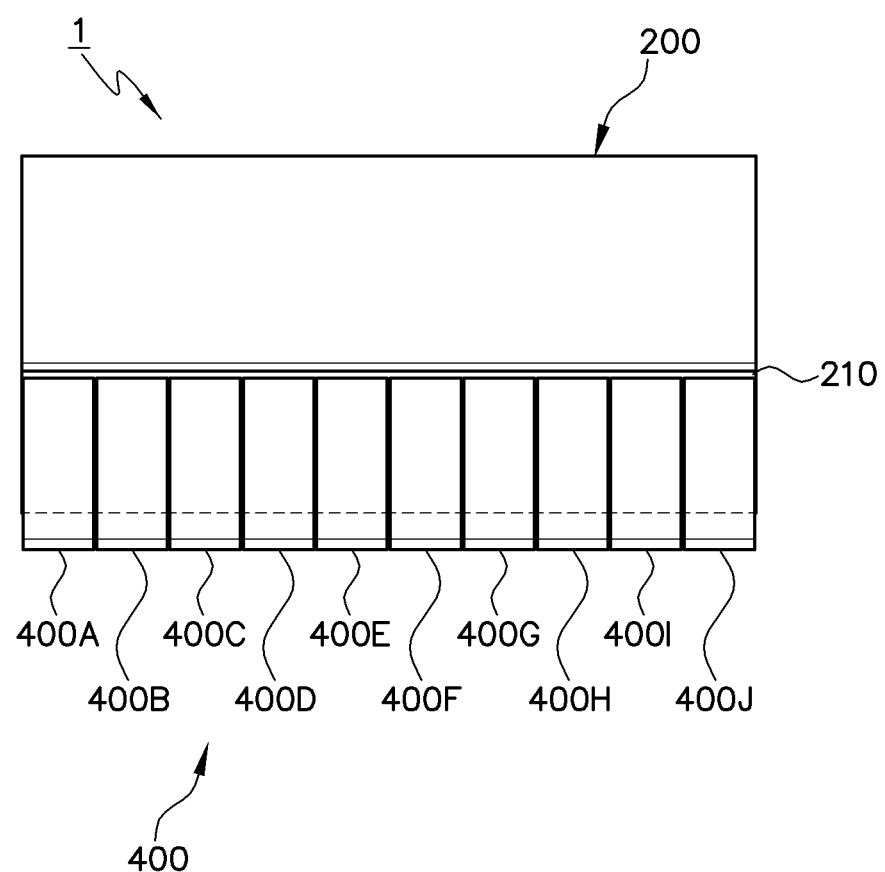
FIG. 4 is a view illustrating an arrangement state of a plurality of variable nozzles constituting the slot die with the variable nozzles according to embodiments of the present invention.

FIG. 1 is a perspective view illustrating structure of a slot die with variable nozzles according to embodiments of the present invention. FIG. 2 is an exploded perspective view illustrating the structure of the slot die with the variable nozzles according to embodiments of the present invention. FIG. 3 is a front view illustrating the structure of the slot die with the variable nozzles according toe embodiments of the present invention. FIG. 4 is a view illustrating an arrangement state of a plurality of variable nozzles constituting the slot die with the variable nozzles according to embodiments of the present invention.

As illustrated in FIGS. 1 to 4, a slot die 1 with variable nozzles according to embodiments of the present invention may include a first body 100, a second body 200, a shim plate 300, and a plurality of variable nozzles 400.

The first body 100 may have a cavity 110 therein in which ink I supplied from the outside is accommodated. The second body 200 may be spaced apart from the first body 100 in a transfer direction of a substrate (S of FIG. 5) or a direction opposite to the transfer direction.

As illustrated in FIGS. 1 and 2, the first body 100 and the second body 200 may each be formed to have a length corresponding to a width of the substrate and have a cross section which becomes gradually narrower toward a lower direction thereof. A supply hole 120, to which a pipe configured to receive the ink I from an ink storage tank (not shown) provided outside is connected, may be formed in one side of the body 100.

The shim plate 300 may be made of a metal material having a thin plate shape formed substantially the same as a surface on which the first body 100 and the second body 200 are coupled. The shim plate 300 may be interposed and coupled between the first body 100 and the second body 200.

As illustrated in FIGS. 2 and 3, an discharge port 310 may be formed in a lower end of the shim plate 300 to communicate with the cavity 110 formed in the first body 100 and to discharge the ink I accommodated in the cavity 110 toward the substrate. The discharge port 310 may be elongated in a longitudinal direction of the first body 100 and the second body 200 at a lower end center of the shim plate 300. The discharge port 310 may determine a coating width of the ink I discharged to the substrate.

The plurality of variable nozzles 400 may be disposed at a lower end of the first body 100 or the second body 200 so as to be adjacent to the discharge port 310 in a width direction of the substrate perpendicular to the transfer direction (or the direction opposite to the transfer direction). As illustrated in FIG. 3, the plurality of variable nozzles 400 may be detachably coupled to the lower end of the first body 100 or the second body 200. The plurality of variable nozzles 400 may each be independently driven at the lower end of the first body 100 or the second body 200. A detailed structure of the variable nozzles 400 will be described in detail with reference to FIGS. 7 to 14.

Meanwhile, FIG. 4 viewed in direction A of FIG. 3 illustrates an example in which ten variable nozzles 400A to 400J are disposed in a line in the width direction of the substrate at the lower end 210 of the second body 200 (or the first body 100). However, the number and arrangement of the variable nozzles 400 may be freely changed according to various conditions such as the type of the substrate, the type of the ink I, and transfer speed of the substrate. In addition, FIGS. 1 to 3 illustrate an example in which the plurality of variable nozzles 400 are disposed only at the lower end 210 of the second body 200, in which the cavity 110 is not formed. Alternatively, the plurality of variable nozzles 400 may be disposed only at the lower end of the first body 100 or may be disposed at both the lower ends of the first body 100 and the second body 200.

Each of the plurality of variable nozzles 400 constituting the slot die 1 with the variable nozzles according to embodiments of the present invention may be independently driven according to the state of the ink I to be coated on the substrate. The plurality of variable nozzles 400 may adjust a partial discharge amount of the ink I discharged from the discharge port 310 by changing a partial area of the discharge port 310 at a position where each of the plurality of variable nozzles 400 is disposed when being driven.

Hereinafter, operation of the slot die 1 with the variable nozzles according to embodiments of the present invention will be described with reference to FIGS. 5 to 6.

Figure 5:
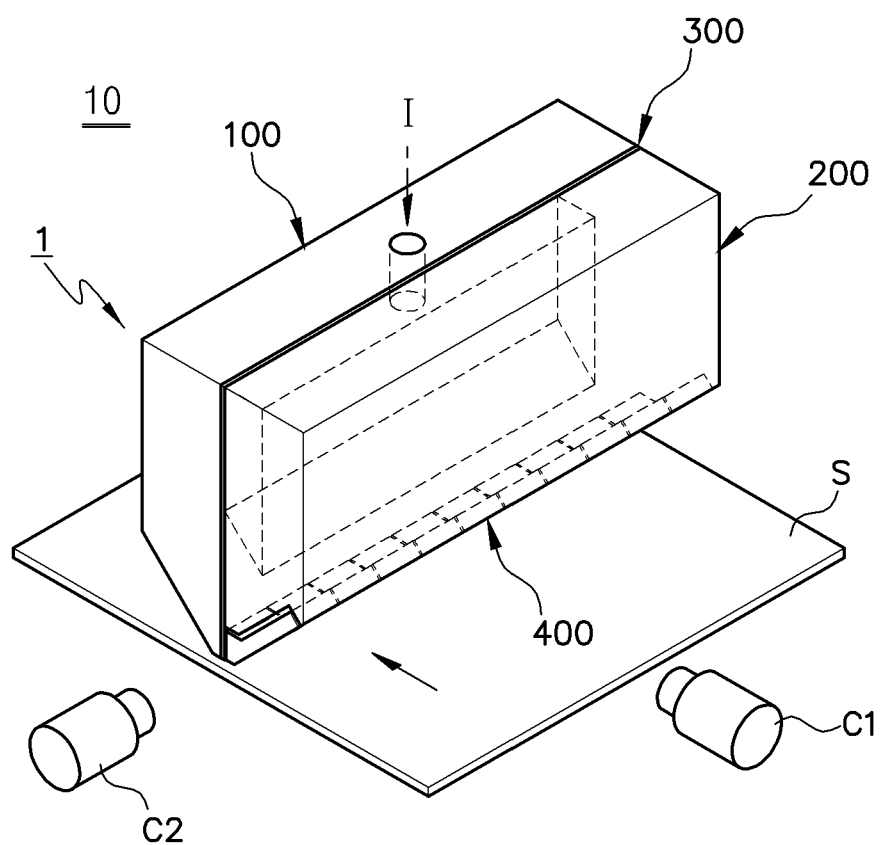
FIG. 5 is a perspective view schematically illustrating a substrate coating device including the slot die with the variable nozzles according to embodiments of the present invention.

FIG. 5 is a perspective view schematically illustrating a substrate coating device including the slot die with the variable nozzles according to embodiments of the present invention. FIG. 6 is a view illustrating operation of the slot die with the variable nozzles according to embodiments of the present invention.

As illustrated in FIG. 5, a substrate coating device 10 may include the slot die 1 of the present invention and one or more cameras C1 and C2.

One or more cameras C1 and, C2 may include a first camera C1 disposed in at least one of a front end and a rear end of the slot die 1 in the transfer direction of the substrate S and a second camera C2 disposed in at least one of both ends of the slot die 1. FIG. 5 illustrates that one first camera C1 and one second camera C2 are provided, but the number and position of the first camera C1 and the second camera C2 may be freely changed by a person skilled in the art.

The first camera C1 and the second camera C2 constituting the substrate coating device 10 may photograph a shape of the ink I coated on the substrate S by photographing a space between the slot die 1 and the substrate S. A real image of the ink I captured through the first camera C1 and the second camera C2 becomes a reference for determining a state of the ink I coated on the substrate S.

Figure 6:
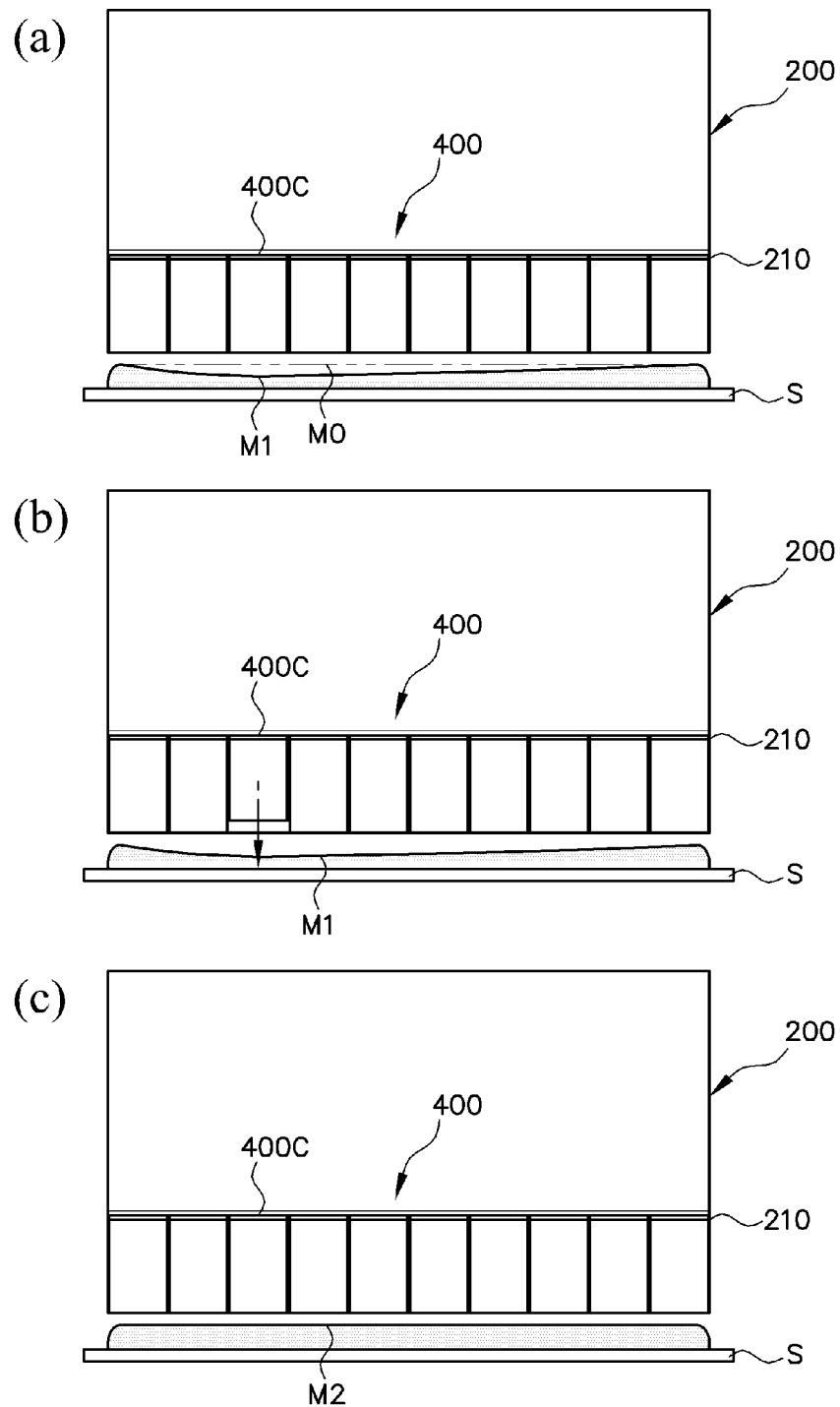
FIG. 6 is a view illustrating operation of the slot die with the variable nozzles according to embodiments of the present invention.

(a) of FIG. 6 is a view illustrating a state of the ink I coated on the substrate S. (b) of FIG. 6 is a view illustrating a state in which the variable nozzle 400C is driven at a specific position. (c) of FIG. 6 is a view illustrating a state in which the state of the ink I coated on the substrate S is changed by driving the corresponding variable nozzle 400C.

As illustrated in (a) of FIG. 6, after a real image M1 of the ink I captured through the first camera C1 is compared with a preset reference image M0, as illustrated in (b) of FIG. 6, in order to align the real image M1 with the reference image M0, among the plurality of variable nozzles 400, the variable nozzle 400C at a specific position is driven to change a partial area of the discharge port 310 at a corresponding position, thereby adjusting a partial discharge amount of the ink I (for example, increasing the partial discharge amount in (b) of FIG. 6). Therefore, as illustrated in (c) of FIG. 6, the slot die 1 may uniformly coat the ink I in the width direction of the substrate S.

As described above, in the slot die 1 with the variable nozzles according to embodiments of the present invention, each of the plurality of variable nozzles 400 may be independently driven according to the state of the ink I coated on the substrate S during a substrate coating process to control the partial discharge amount of the ink I, thereby improving coating uniformity of the ink I in the width direction of the substrate S.

In addition, in the slot die 1 with the variable nozzles according to embodiments of the present invention, since the plurality of variable nozzles 400 are detachably coupled to the lower end of the first body 100 or the second body 200, even when a foreign material is introduced into the discharge port 310 during the substrate coating process, only a specific variable nozzle 400 may be disassembled and assembled without entirely disassembling the slot die 1, thereby improving convenience of maintenance.

Hereinafter, a structure of a slot die 1 with variable nozzles according to a first embodiment of the present invention as configured above will be described with reference to FIGS. 7 to 10.

Figure 7:
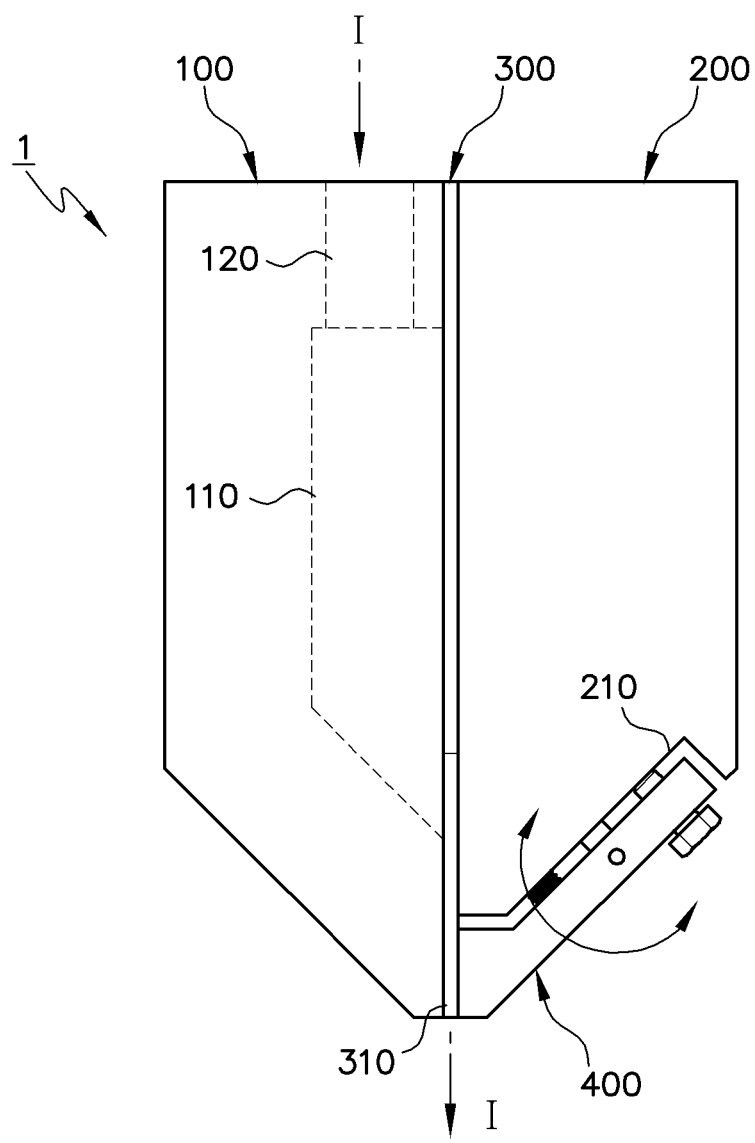
FIG. 7 is a front view illustrating a structure of a slot die with variable nozzles according to a first embodiment of the present invention.
Figure 8:
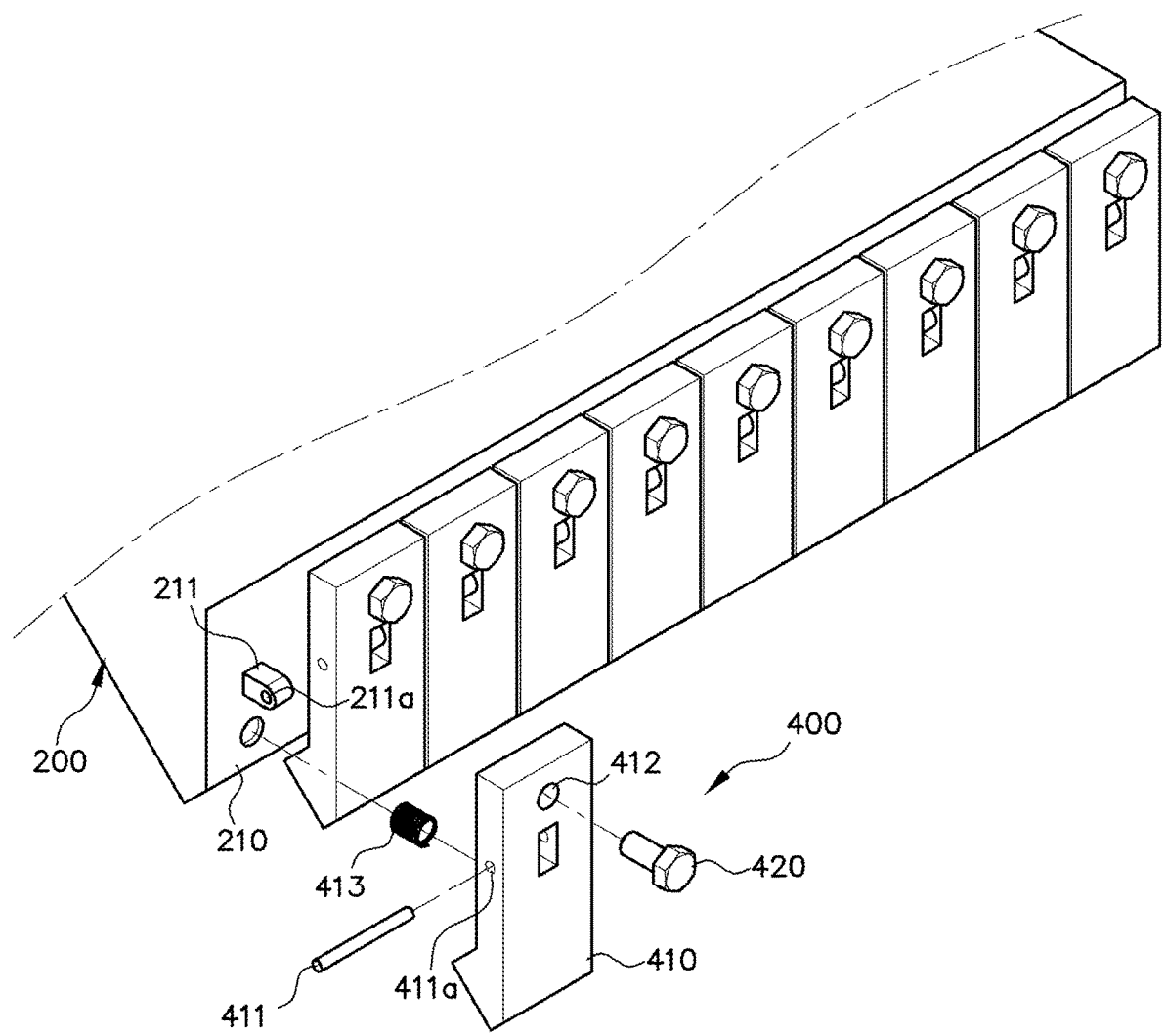
FIG. 8 is an exploded perspective view illustrating a structure of variable nozzles constituting the slot die with the variable nozzles according to the first embodiment of the present invention.
Figure 9:
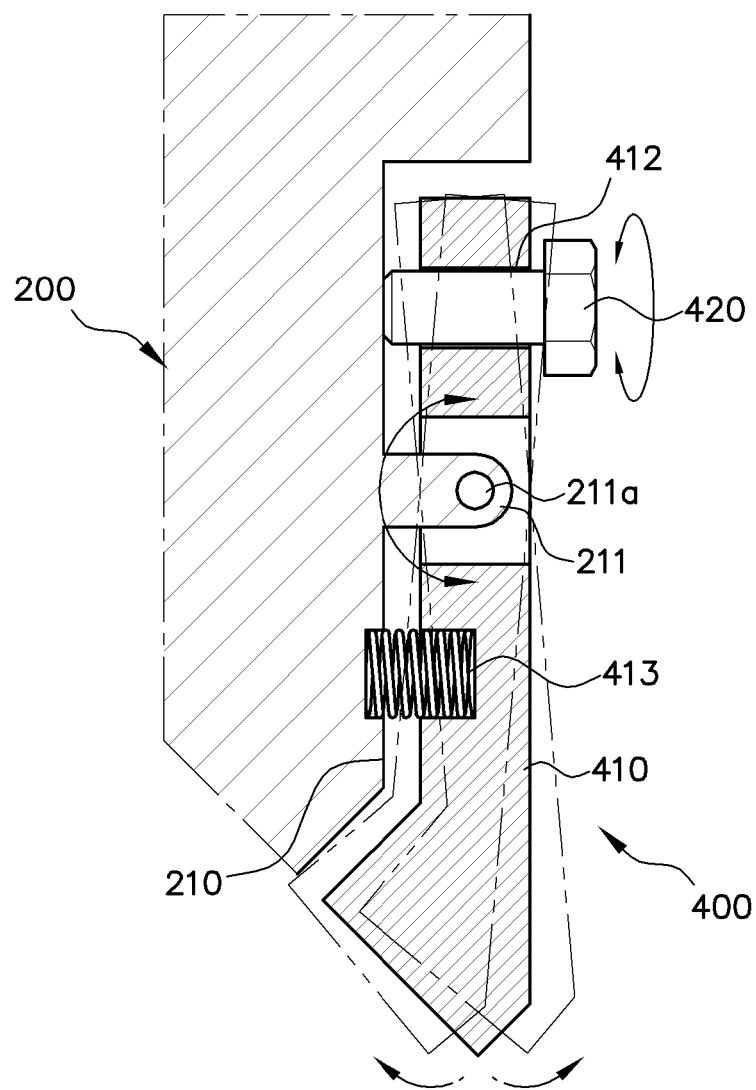
FIG. 9 is a longitudinal sectional view illustrating the structure of the variable nozzles constituting the slot die with the variable nozzles according to the first embodiment of the present invention.

FIG. 7 is a front view illustrating a structure of a slot die with variable nozzles according to a first embodiment of the present invention. FIG. 8 is an exploded perspective view illustrating a structure of variable nozzles constituting the slot die with the variable nozzles according to the first embodiment of the present invention. FIG. 9 is a longitudinal sectional view illustrating the structure of the variable nozzles constituting the slot die with the variable nozzles according to the first embodiment of the present invention.

As illustrated in FIGS. 7 to 9, variable nozzles 400 constituting a slot die 1 with variable nozzles according to a first embodiment of the present invention may each include a rotation block 410 and an angle adjustment portion 420.

The rotation block 410 may be rotatably connected to a lower end of a first body 100 or a second body 200. The angle adjustment portion 420 may be connected to the rotation block 410 and may adjust an angle of the rotation block 410 with respect to the lower end of the first body 100 or the second body 200. Therefore, when the angle of the rotation block 410 with respect to the first body 100 or the second body 200 is changed by the angle adjustment portion 420, the rotation block 410 may change a partial area of an discharge port 310.

As illustrated in FIG. 8, the rotation block 410 may have a thin plate shape and may be hinged to a second hinge hole 211a formed in a hinge arm 211 protruding from the lower end 210 of the second body 200 (or the first body 100) through a pin 411 inserted into a first hinge hole 411a formed in a central portion thereof. In addition, as illustrated in FIG. 9, one end of the rotation block 410 may have a protruding shape such that when the rotation block 410 is rotated at a certain angle with respect to the second hinge hole 211a, the partial area of the discharge port 310 formed in a shim plate 300 is changed.

As illustrated in FIG. 8, the angle adjustment portion 420 is screw-coupled to a through-hole 412 having a female screw shape formed adjacent to the first hinge hole 411a of the rotation block 410 and may include a screw member (or a bolt member) connected to the lower end 210 of the second body 200 (or the first body 100). Therefore, as shown in FIG. 9, When the angle adjustment portion 420 is rotated in a state of being screw-coupled to the through-hole 412, the angle adjustment portion 420 may adjust the angle of the rotation block 410 with respect to the first body 100 or the second body 200 by rotating the rotation block 410 with respect to the second hinge hole 211a.

Meanwhile, as illustrated in FIGS. 8 and 9, as needed, an elastic member 413 configured to provide a return force to the rotation block 410 when the rotation block 410 is rotated may be installed between the rotation block 410 and the lower end 210 of the second body 200 (or the first body 100).

On the other hand, the plurality of variable nozzles 400 may each further include an angle adjustment driver 430 configured to drive at least one of the rotation block 410 and the angle adjustment portion 420.

Figure 10:
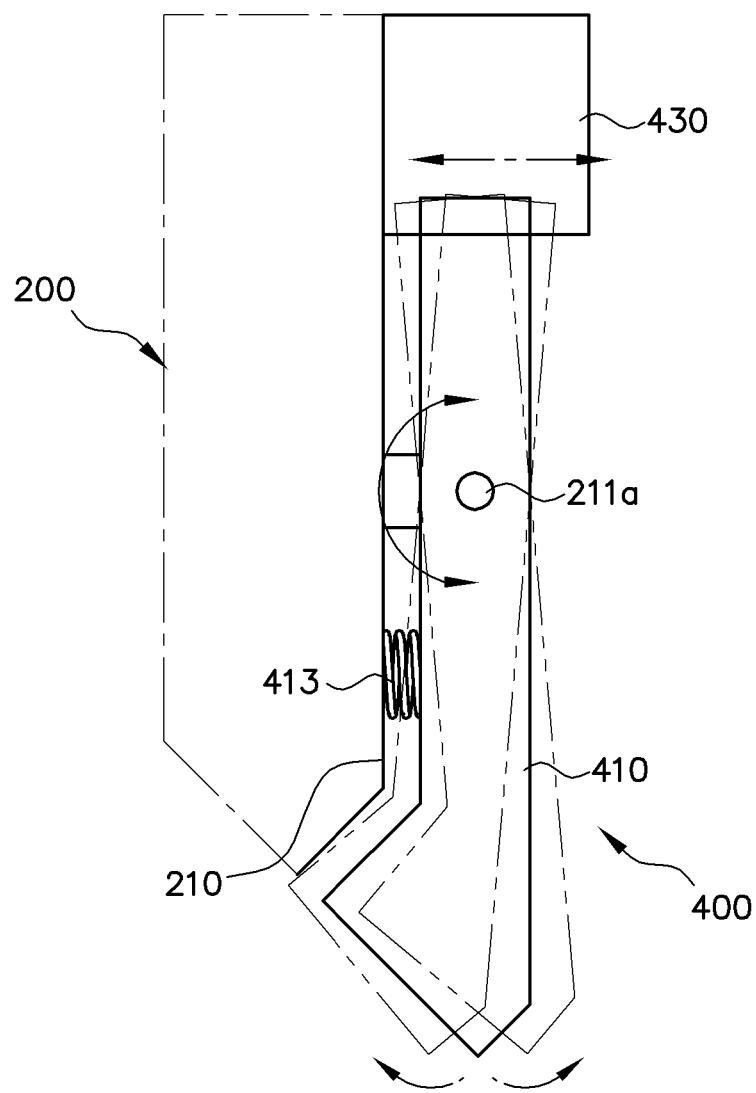
FIG. 10 is a schematic front view illustrating a structure when the slot die with the variable nozzles according to the first embodiment of the present invention includes an angle adjustment driver.

FIG. 10 is a schematic front view illustrating a structure when the slot die with the variable nozzles according to the first embodiment of the present invention includes an angle adjustment driver.

The angle adjustment driver 430 may be connected to at least one of the rotation block 410 and the angle adjustment portion 420 and may drive at least one of the rotation block 410 and the angle adjustment portion 420 according to a state of the ink I coated on the substrate S. That is, the angle adjustment driver 430 may function to automatically drive the rotation block 410 such that the rotation block 410 changes a partial area of the discharge port 310 according to a state of the ink I photographed through one or more cameras C1 and C2.

FIG. 10 illustrates an example in which the angle adjustment driver 430 is connected to the other end of the rotation block 410 to rotate the rotation block 410 with respect to the second hinge hole 211a. Although not shown, the angle adjustment driver 430 may include various types of actuators such as a driving motor and a driving cylinder, and a power transmitting member configured to connect the actuator and the rotation block 410.

While FIG. 10 illustrates an example in which the angle adjustment driver 430 is directly connected to the rotation block 410, the angle adjustment driver 430 may be connected to the angle adjustment portion 420 or may be connected to both the rotation block 410 and the angle adjustment portion 420.

Hereinafter, a structure of a slot die 1 with variable nozzles according to a second embodiment of the present invention as configured above will be described with reference to FIGS. 11 to 14. For convenience of description, the same structures as those of the first embodiment shown in FIGS. 7 to 10 will be omitted, and only differences will be mainly described below.

Figure 11:
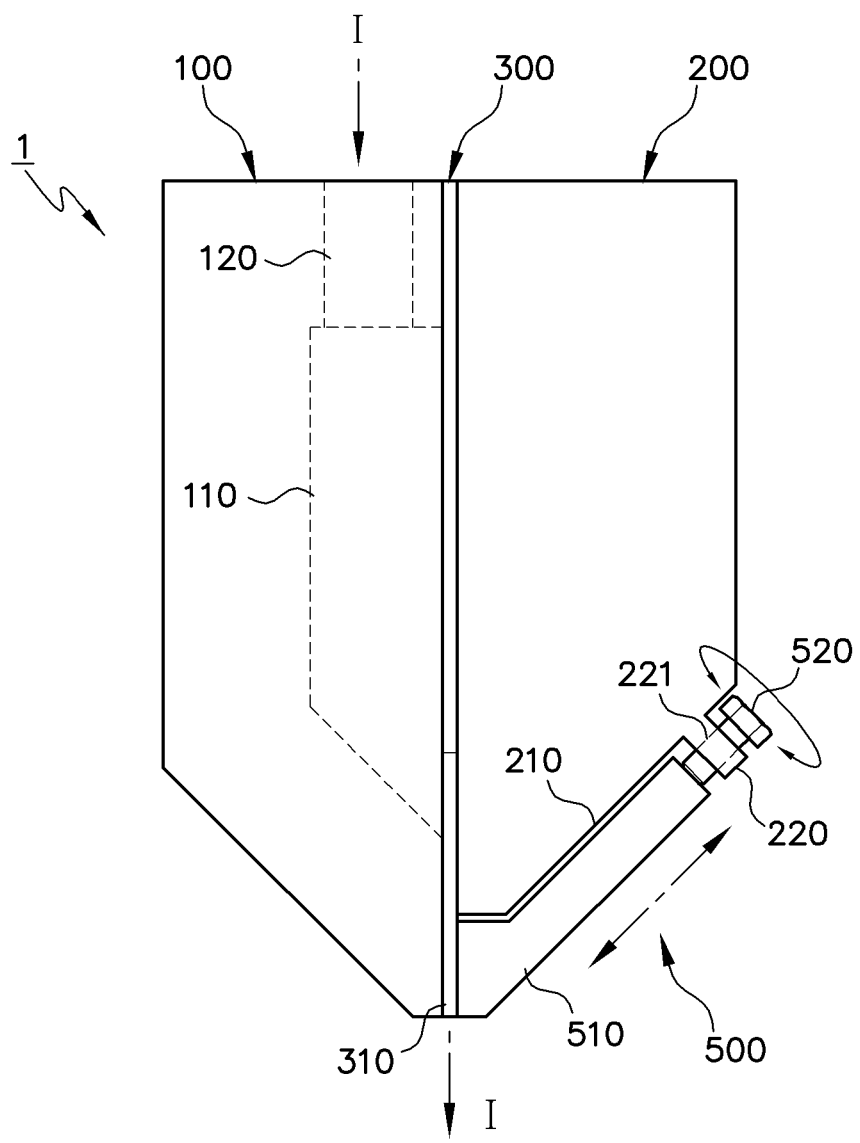
FIG. 11 is a front view illustrating a structure of a slot die with variable nozzles according to a second embodiment of the present invention.
Figure 12:
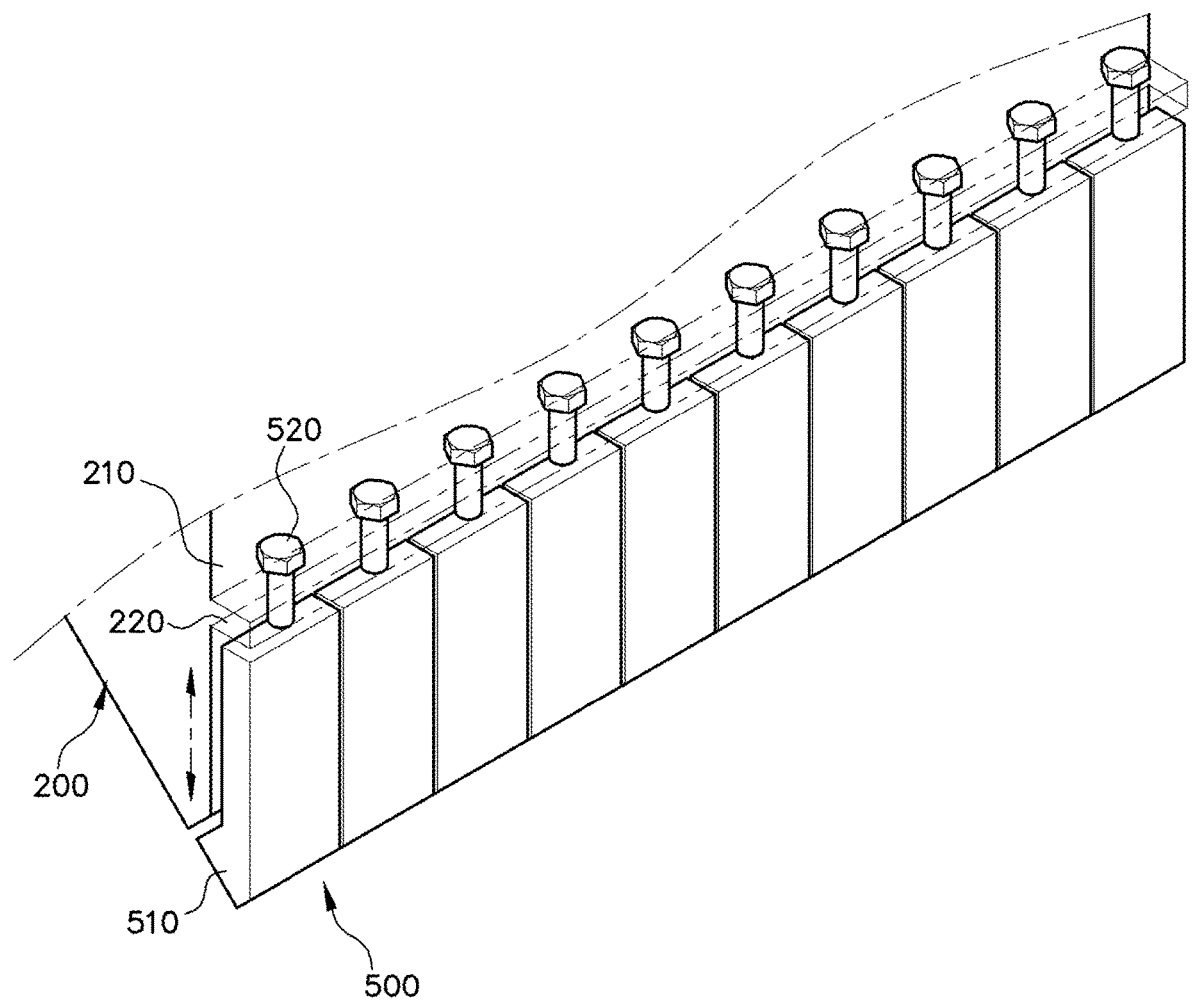
FIG. 12 is a perspective view illustrating a structure of variable nozzles constituting the slot die with the variable nozzles according to the second embodiment of the present invention.
Figure 13:
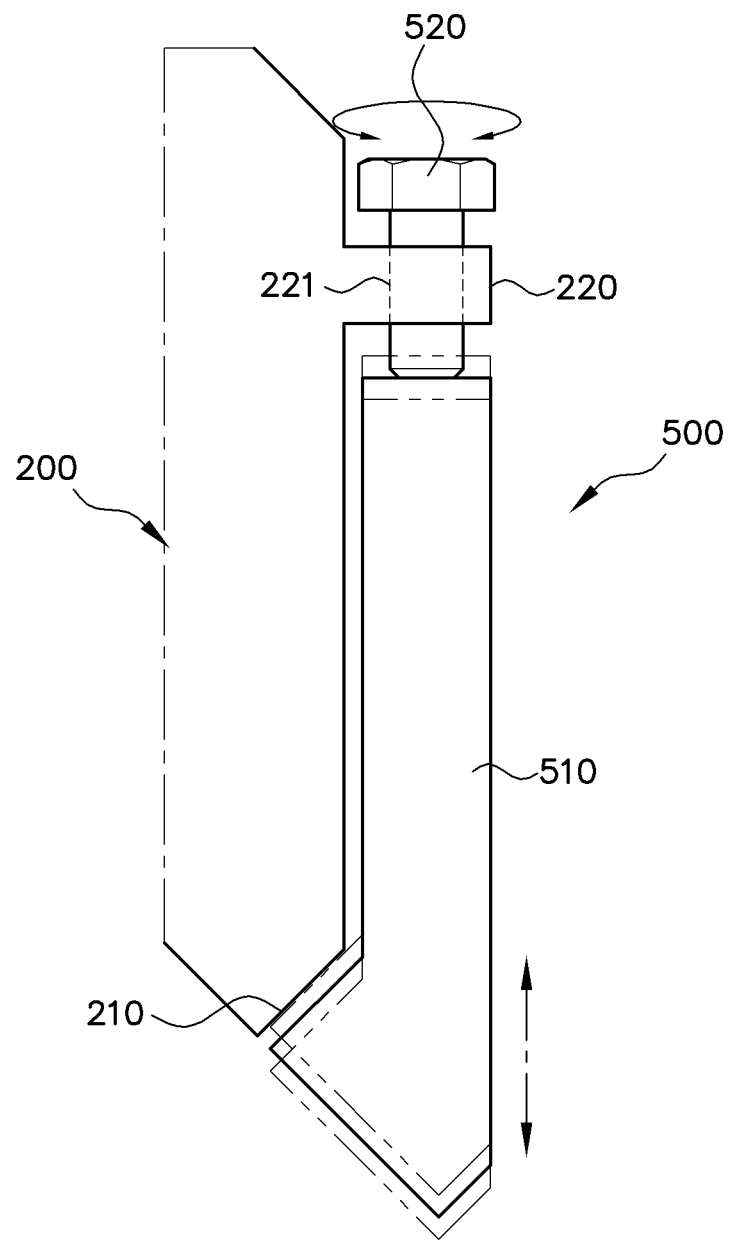
FIG. 13 is a front view illustrating the structure of the variable nozzles constituting the slot die with the variable nozzles according to the second embodiment of the present invention.

FIG. 11 is a front view illustrating a structure of a slot die with variable nozzles according to a second embodiment of the present invention. FIG. 12 is a perspective view illustrating a structure of variable nozzles constituting the slot die with the variable nozzles according to the second embodiment of the present invention. FIG. 13 is a front view illustrating the structure of the variable nozzles constituting the slot die with the variable nozzles according to the second embodiment of the present invention.

Unlike the first embodiment in which each of the plurality of variable nozzles 500 is rotationally driven, in a slot die 1 with variable nozzles according to a second embodiment of the present invention shown in FIGS. 11 to 14, the plurality of variable nozzles 500 may be linearly driven. That is, the variable nozzles 500 constituting the slot die 1 with the variable nozzles according to the second embodiment of the present invention may each include a movement block 510 and a position adjustment portion 520.

The movement block 510 may be movably coupled to a lower end of a first body 100 or a second body 200. The position adjustment portion 520 may be connected to the movement block 510 and may adjust a position of the movement block 510 with respect to the lower end of the first body 100 or the second body 200. Therefore, when the position of the movement block 510 with respect to the first body 100 or the second body 200 is changed by the position adjustment portion 520, the movement block 510 may change a partial area of an discharge port 310.

As illustrated in FIGS. 11 and 12, the movement block 510 may have a thin plate shape and may be coupled to the lower end 210 of the second body 200 (or the first body 200) so as to reciprocate in a direction toward the discharge port 310 formed in a shim plate 300. In addition, as illustrated in FIG. 13, one end of the movement block 510 may have a protruding shape such that when the movement block 510 reciprocates in the direction toward the discharge port 310, a partial area of the discharge port 310 is changed.

As illustrated in FIG. 12, the position adjustment portion 520 is screw-coupled to a coupling hole 221 of a fixing end 220 elongated in a width direction of a substrate S at the lower end 210 of the second body 200 (or the first body 100) so as to be adjacent to the other end of the movement block 510. The position adjustment portion 520 may include a screw member (or a bolt member) connected to the other end of the movement block 510. Therefore, as illustrated in FIG. 13, when the position adjustment portion 520 is rotated in a state of being screw-coupled to the coupling hole 221, the position adjustment portion 520 may allow the movement block 510 to reciprocate in a direction toward the discharge port 310.

Meanwhile, although not shown, as needed, a guide portion (not shown) may be provided between the movement block 510 and the lower end 210 of the second body 200 (or the first body) to guide movement of the movement block 510 when the movement block 510 reciprocates. The guide portion may include a guide groove and a guide protrusion, which are respectively formed on the movement block 510 and the lower end 210 of the second body (or the first body 100), or may include a linear motion guide.

On the other hand, the plurality of variable nozzles 500 may each further include a position adjustment driver 530 configured to drive at least one of the movement block 510 and the position adjustment portion 520.

Figure 14:
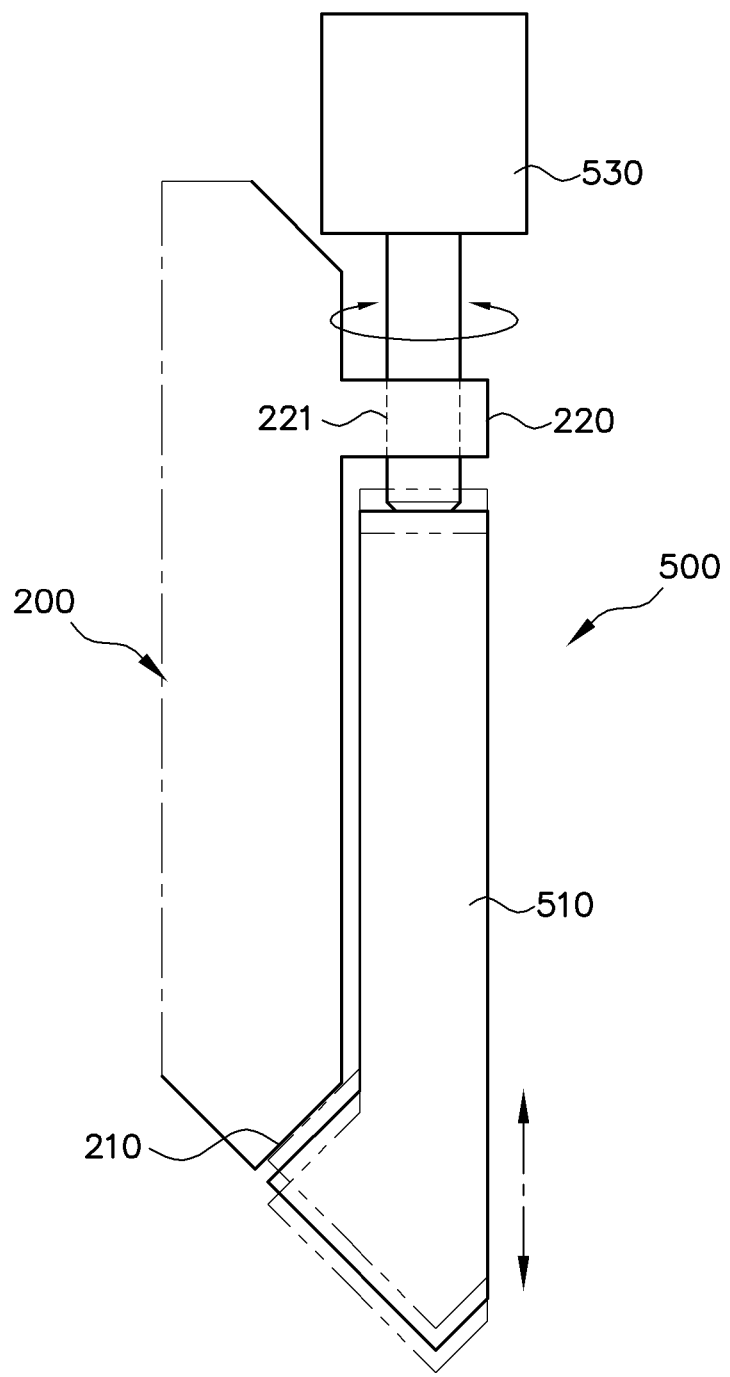
FIG. 14 is a schematic front view illustrating a structure when the slot die with the variable nozzles according to the second embodiment of the present invention includes a position adjustment driver.

FIG. 14 is a schematic front view illustrating a structure when the slot die with the variable nozzles according to the second embodiment of the present invention includes a position adjustment driver.

The position adjustment driver 530 may be connected to at least one of the movement block 510 and the position adjustment portion 520 and may drive at least one of the movement block 510 and the position adjustment portion 520 according to a state of the ink I coated on the substrate S. That is, the position adjustment driver 530 may function to automatically drive the movement block 510 such that the movement block 510 changes a partial area of the discharge port 310 according to a state of the ink I photographed through one or more cameras C1 and C2.

FIG. 14 illustrates an example in which the position adjustment driver 530 is connected to the other end of the movement block 510 and allows the movement block 510 to reciprocate in a direction toward the discharge port 310. Although not shown, the position adjustment driver 530 may include various types of actuators such as a driving motor and a driving cylinder, and a power transmitting member configured to connect the actuator and the rotation block 510

While FIG. 14 illustrates an example in which the position adjustment driver 530 is directly connected to the movement block 510, the position adjustment driver 530 may be connected to the position adjustment portion 520 or may be connected to both the movement block 510 and the position adjustment portion 520.

Meanwhile, while a slot die used in a coating device performing a coating process on a substrate has been described as an example in the present invention, the scope of application of the present invention is not limited thereto. The present invention can be applied to various process and technical fields as long as it is a device for performing a process by discharging the ink I on the substrate.

Although the invention has been shown and described with respect to the preferred embodiments, and specific terms have been used, the preferred embodiments and specific terms are used in their general meaning only, in order to easily describe the technical content of the present invention and to facilitate the understanding of the present invention, and are not intended to limit the scope of the present invention. It will be understood by those skilled in the art that various changes and modifications may be made without departing from the spirit and scope of the invention as defined in the following claims.

INDUSTRIAL APPLICABILITY

The present invention relates to a slot die with variable nozzles. Specifically, the present invention may be applied to technical fields related to a slot die capable of improving coating uniformity of ink in a width direction of a substrate and improving convenience of maintenance.

The invention claimed is:
1. A slot die with variable nozzles which applies ink on a substrate to perform a coating process, the slot die comprising:
    a first body having a cavity configured to accommodate the ink supplied from the outside;
    a second body spaced apart from the first body in a transfer direction of the substrate or a direction opposite to the transfer direction;
    a shim plate disposed between the first body and the second body and having a discharge port configured to communicate with the cavity and discharge the ink accommodated in the cavity toward the substrate; and
    a plurality of variable nozzles disposed at a lower end of the first body or the second body in a width direction of the substrate so as to be adjacent to the discharge port, wherein each of the plurality of variable nozzles is independently driven according to a state of the ink coated on the substrate and adjusts a partial discharge amount of the ink discharged from the discharge port by changing a partial area of the discharge port at an arrangement position thereof,
    wherein each of the plurality of variable nozzles comprises:
        a rotation block rotatably connected to the lower end of the first body or the second body; and
        an angle adjustment portion connected to the rotation block and configured to adjust an angle of the rotation block with respect to the lower end of the first body or the second body,
    wherein, when the angle with respect to the lower end of the first body or the second body is changed by the angle adjustment portion, the rotation block changes the partial area of the discharge port at the arrangement position thereof, and
    wherein the rotation block is hinge-coupled to a second hinge hole formed in a hinge arm protruding from the lower end of the first body or the second body through a pin inserted into a first hinge hole formed at a central portion thereof.
2. The slot die of claim 1, wherein the angle adjustment portion is screw-coupled to a through-hole having a female screw formed at a position adjacent to the first hinge hole and comprises a screw member connected to the lower end of the first body or the second body.
3. The slot die of claim 1, wherein the each of the plurality of variable nozzles further comprises an angle adjustment driver connected to at least one of the rotation block and the angle adjustment portion and configured to drive at least one of the rotation block and the angle adjustment portion according to the state of the ink coated on the substrate.

* * * * *